(12) United States Patent
Lassalle-Balier et al.

(10) Patent No.: US 11,630,168 B2
(45) Date of Patent: Apr. 18, 2023

(54) LINEAR SENSOR WITH DUAL SPIN VALVE ELEMENT HAVING REFERENCE LAYERS WITH MAGNETIZATION DIRECTIONS DIFFERENT FROM AN EXTERNAL MAGNETIC FIELD DIRECTION

(71) Applicant: Allegro MicroSystems, LLC, Manchester, NH (US)

(72) Inventors: Rémy Lassalle-Balier, Bures sur Yvette (FR); Maxime Rioult, Massy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 135 days.

(21) Appl. No.: 17/166,301

(22) Filed: Feb. 3, 2021

(65) Prior Publication Data
US 2022/0244328 A1    Aug. 4, 2022

(51) Int. Cl.
*G01R 33/09* (2006.01)
*H10N 50/85* (2023.01)
*H10N 50/80* (2023.01)
*H10N 50/10* (2023.01)
*H01L 43/10* (2006.01)
(Continued)

(52) U.S. Cl.
CPC ......... *G01R 33/093* (2013.01); *G01R 33/098* (2013.01); *H01L 43/02* (2013.01); *H01L 43/08* (2013.01); *H01L 43/10* (2013.01)

(58) Field of Classification Search
CPC ............... G01R 33/093; G01R 33/098; G01R 33/0029; G01R 33/0052; G01R 33/091; G01R 33/1284; H01L 43/02; H01L 43/08; H01L 43/10
See application file for complete search history.

(56) References Cited

U.S. PATENT DOCUMENTS 6,185,080 B1 *  2/2001  Gill ...................... G11B 5/3903
                                                          365/158
6,278,589 B1 *  8/2001  Gill ...................... G11B 5/3954
(Continued)

FOREIGN PATENT DOCUMENTS

EP           2323189 A1      5/2011

OTHER PUBLICATIONS

U.S. Appl. No. 16/507,544, filed Jul. 10, 2019, David et al.
(Continued)

*Primary Examiner* — Brian E Miller
(74) *Attorney, Agent, or Firm* — Daly, Crowley, Mofford & Durkee, LLP

(57) ABSTRACT

In one aspect, a linear sensor includes at least one magnetoresistance element that includes a first spin valve and a second spin valve positioned on the first spin valve. The first spin valve includes a first set of reference layers having a magnetization direction in a first direction and a first set of free layers having a magnetization direction in a second direction orthogonal to the first direction. The second spin valve includes a second set of reference layers having a magnetization direction in the first direction and a second set of free layers having a magnetization direction in a third direction orthogonal to the first direction and antiparallel to the second direction. The first direction is neither parallel nor antiparallel to a direction of an expected magnetic field.

20 Claims, 10 Drawing Sheets

(51) Int. Cl.
  *H01L 43/02* (2006.01)
  *H01L 43/08* (2006.01)

(56) References Cited

U.S. PATENT DOCUMENTS

| | | | |
|---|---|---|---|
| 6,633,461 B2* | 10/2003 | Gill | G11B 5/3909 |
| 6,819,530 B2* | 11/2004 | Gill | B82Y 10/00 |
| | | | 360/324.12 |
| 7,777,607 B2 | 8/2010 | Taylor et al. | |
| 9,529,060 B2 | 12/2016 | Fermon et al. | |
| 9,741,372 B1 | 8/2017 | Campiglio | |
| 9,804,234 B2 | 10/2017 | Dressler et al. | |
| 9,812,637 B2 | 11/2017 | Fermon et al. | |
| 9,880,026 B1 | 1/2018 | Eagen et al. | |
| 9,922,673 B2 | 3/2018 | Campiglio et al. | |
| 10,012,518 B2 | 7/2018 | David et al. | |
| 10,026,425 B2 | 7/2018 | Campiglio | |
| 10,041,810 B2 | 8/2018 | Vig et al. | |
| 10,050,193 B1 | 8/2018 | Klebanov et al. | |
| 10,078,117 B2 | 9/2018 | Monreal et al. | |
| 10,114,085 B2 | 10/2018 | Eagen et al. | |
| 10,215,590 B2 | 2/2019 | David et al. | |
| 10,347,277 B2 | 7/2019 | Campiglio et al. | |
| 10,468,055 B1* | 11/2019 | Sapozhnikov | G11B 5/112 |
| 10,593,869 B2 | 3/2020 | Wong et al. | |
| 10,605,874 B2 | 3/2020 | Lasalle-Balier et al. | |
| 10,620,279 B2 | 4/2020 | Campiglio et al. | |
| 10,670,669 B2 | 6/2020 | Lassalle-Balier et al. | |
| 10,734,443 B2 | 8/2020 | Lassalle-Balier et al. | |
| 10,746,820 B2 | 8/2020 | Lassalle-Balier et al. | |
| 10,753,989 B2 | 8/2020 | Campiglio et al. | |
| 10,777,345 B2 | 9/2020 | Lasalle-Balier et al. | |
| 10,809,094 B2 | 10/2020 | Foletto et al. | |
| 10,840,001 B2 | 11/2020 | Lassalle-Balier et al. | |
| 10,859,643 B2 | 12/2020 | Lasalle-Balier | |
| 10,866,287 B1 | 12/2020 | Lasalle-Balier et al. | |
| 11,002,807 B2 | 5/2021 | Campiglio et al. | |
| 11,022,661 B2 | 6/2021 | Lasalle-Balier et al. | |
| 11,408,948 B2* | 8/2022 | Lassalle-Balier | G01R 33/0023 |
| 2004/0170055 A1* | 9/2004 | Albert | G11C 11/16 |
| | | | 365/173 |
| 2004/0218311 A1* | 11/2004 | Saito | G01R 33/093 |
| | | | 360/324.12 |
| 2006/0002031 A1* | 1/2006 | Shoji | G11B 5/127 |
| | | | 360/324.1 |
| 2006/0072249 A1* | 4/2006 | Wakui | G11B 5/3903 |
| | | | 257/E27.005 |
| 2008/0116886 A1* | 5/2008 | Yamada | G01D 5/145 |
| | | | 324/207.21 |
| 2009/0189601 A1* | 7/2009 | Okada | G01D 5/145 |
| | | | 324/207.21 |
| 2010/0327857 A1 | 12/2010 | Hoshiya et al. | |
| 2011/0025318 A1* | 2/2011 | Saruki | G01R 33/0023 |
| | | | 324/252 |
| 2011/0062537 A1 | 3/2011 | Oh et al. | |
| 2012/0112741 A1 | 5/2012 | Meguro et al. | |
| 2012/0225322 A1* | 9/2012 | Han | B82Y 10/00 |
| | | | 428/815 |
| 2014/0176132 A1* | 6/2014 | Chen | G01R 33/0017 |
| | | | 324/252 |
| 2014/0354270 A1* | 12/2014 | Kawano | G01R 33/09 |
| | | | 324/207.21 |
| 2016/0313411 A1* | 10/2016 | Koike | G01R 33/098 |
| 2017/0243604 A1* | 8/2017 | Sugawara | G11B 5/3954 |
| 2018/0335484 A1* | 11/2018 | Campiglio | G01R 33/093 |
| 2019/0170835 A1* | 6/2019 | Endo | H01F 10/12 |
| 2019/0178954 A1 | 6/2019 | Lasalle-Balier et al. | |
| 2019/0234763 A1 | 8/2019 | Foletto et al. | |
| 2019/0235032 A1 | 8/2019 | Lassalle-Balier | |
| 2020/0033424 A1 | 1/2020 | Campiglio et al. | |
| 2020/0041310 A1 | 2/2020 | Lassalle-Balier et al. | |
| 2020/0041583 A1 | 2/2020 | Cadugan et al. | |
| 2020/0064413 A1* | 2/2020 | Campiglio | H01L 43/08 |
| 2020/0066790 A1* | 2/2020 | Lassalle-Balier | G01R 33/09 |
| 2020/0225020 A1* | 7/2020 | Lassalle-Balier | G01B 7/14 |
| 2020/0333408 A1* | 10/2020 | Engel | G01R 33/098 |
| 2020/0348374 A1* | 11/2020 | Saito | H01L 43/10 |
| 2020/0365309 A1 | 11/2020 | Lasalle-Balier et al. | |
| 2021/0065949 A1 | 3/2021 | Campiglio et al. | |
| 2021/0066391 A1 | 3/2021 | Campiglio et al. | |
| 2021/0149000 A1* | 5/2021 | Saito | G01R 33/098 |
| 2021/0293907 A1* | 9/2021 | Lassalle-Balier | G01R 33/091 |
| 2021/0293910 A1* | 9/2021 | Lassalle-Balier | G01R 33/0023 |
| 2021/0382122 A1* | 12/2021 | Saito | H01L 43/08 |
| 2021/0405132 A1* | 12/2021 | Kubota | G01B 7/30 |
| 2022/0130442 A1* | 4/2022 | Kalitsov | H01L 43/10 |
| 2022/0163606 A1* | 5/2022 | Tsumita | G11C 11/18 |
| 2022/0244328 A1* | 8/2022 | Lassalle-Balier | H01L 43/02 |

OTHER PUBLICATIONS

U.S. Appl. No. 16/507,552, filed Jul. 10, 2019, Lassalle-Balier et al.
U.S. Appl. No. 16/553,633, filed Aug. 28, 2019, Lassalle-Balier et al.
U.S. Appl. No. 62/171,532, filed Jun. 5, 2015, Fermon, et al.
U.S. Appl. No. 62/894,114, filed Aug. 30, 2019, Campiglio, et al.
U.S. Appl. No. 16/825,368, filed Mar. 20, 2020, Lassalle-Balier, et al.
U.S. Appl. No. 17/166,301, filed Feb. 3, 2021, Lassalle-Balier, et al.
U.S. Appl. No. 16/899,746, filed Jun. 12, 2020, Lassalle-Balier, et al.

* cited by examiner

LINEAR SENSOR WITH DUAL SPIN VALVE ELEMENT HAVING REFERENCE LAYERS WITH MAGNETIZATION DIRECTIONS DIFFERENT FROM AN EXTERNAL MAGNETIC FIELD DIRECTION

BACKGROUND

Magnetic field sensors are used in a variety of applications, including, but not limited to, an angle sensor that senses an angle of a direction of a magnetic field; a current sensor that senses a magnetic field generated by a current carried by a current-carrying conductor; a magnetic switch that senses the proximity of a ferromagnetic object; a rotation detector that senses passing ferromagnetic articles, for example, magnetic domains of a ring magnet or a ferromagnetic target (e.g., gear teeth) where the magnetic field sensor is used in combination with a back-biased or other magnet; a magnetic field sensor that senses a magnetic field density of a magnetic field, a linear sensor that senses a position of a ferromagnetic target; and so forth.

In certain applications, magnetic field sensors include magnetoresistance elements. These elements have an electrical resistance that changes in the presence of an external magnetic field. Spin valves are a type of magnetoresistance element formed from two or more magnetic materials or layers. The simplest form of a spin valve has a reference (or magnetically fixed) layer and a free layer. The resistance of the spin valve changes as a function of the magnetic alignment of the reference and free layers. Typically, the magnetic alignment of the reference layer does not change, while the magnetic alignment of the free layer moves in response to external magnetic fields.

In some cases, a spin valve may also have a bias. The bias may be generated by one or more magnetic layers (bias layers) that are magnetically coupled to the free layer. In the absence of an external magnetic field, the bias layers may cause the magnetic alignment of the free layer to default to a predetermined alignment. The magnetic coupling between the bias layers and the free layer is relatively weak so that an external field can override the bias and realign the magnetic alignment of the free layer.

SUMMARY

In one aspect, a linear sensor includes at least one magnetoresistance element that includes a first spin valve and a second spin valve positioned on the first spin valve. The first spin valve includes a first set of reference layers having a magnetization direction in a first direction, and a first set of free layers having a magnetization direction in a second direction orthogonal to the first direction. The second spin valve includes a second set of reference layers having a magnetization direction in the first direction, and a second set of free layers having a magnetization direction in a third direction orthogonal to the first direction and antiparallel to the second direction. The first direction is neither parallel nor antiparallel to a direction of an expected magnetic field. The at least one magnetic resistance element detects magnetic field changes caused by a target object enabling the linear sensor to provide a differential signal indicating a linear position of the target object.

In another aspect, a linear sensor includes a first bridge and a second bridge. The first bridge includes a first spin valve, a second spin valve in series with the first spin valve, a third spin valve in parallel with the first spin valve and a fourth spin valve in series with the third spin valve. The second bridge includes a fifth spin valve, a sixth spin valve in series with the fifth spin valve element, a seventh spin valve in parallel with the fifth spin valve and an eighth spin valve in series with the seventh spin valve. The first spin valve includes a first set of reference layers having a magnetization direction in a first direction, and a first set of free layers having a magnetization direction in a second direction orthogonal to the first direction. The fifth spin valve is positioned on the first spin valve. The fifth spin valve includes a second set of reference layers having a magnetization direction in the first direction, and a second set of free layers having a magnetization direction in a third direction orthogonal to the first direction and antiparallel to the second direction. The first direction is neither parallel nor antiparallel to a direction of an external magnetic field. The first and second bridges detect magnetic field changes caused by a target object enabling the linear sensor to provide a differential signal indicating a linear position of the target object.

In a further aspect, a method includes forming a linear sensor that includes a first bridge that includes a first set of spin valves and a second bridge that includes a second set of spin valves. The first set of spin valves each includes a first set of reference layers having a magnetization direction in a first direction. The second set of spin valves each includes a second set of reference layers having a magnetization direction in the first direction. The first direction is neither parallel nor antiparallel to a direction of an expected magnetic field. The first direction and the direction of the expected magnetic field form a tilt angle, wherein the tilt angle is greater than 0°. The method further includes measuring a sensitivity of a first bridge to changes in a magnetic field; measuring a sensitivity of a second bridge to changes in the magnetic field; and weighting an output of the first bridge and an output of the second bridge based on the measured sensitivities of the first and second bridges.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a linear sensor that has an increased linear range than traditional linear sensors that use spin valves without necessarily trading off sensitivity of the linear sensors to detect changes in a magnetic field. In one particular example, the linear sensor includes a dual spin valve element that has (1) reference layers that have magnetization directions that are neither parallel nor antiparallel to an external magnetic field, and (2) free layers that have magnetization directions that are opposite from each other and orthogonal to their respective reference layers. As used herein the term "linear range" refers to a range where the changes in resistivity, for example, of an MR element are linear with respect to changes in an intensity of a magnetic field.

As used herein, the term "target object" is used to describe an object to be sensed or detected by a magnetic field sensor or magnetic field sensing element. The target object may include a conductive material that allows for eddy currents to flow within the target, for example a metallic target that conducts electricity.

An example of a magnetic field sensor is a linear sensor. A linear sensor detects magnetic field changes caused by the target object enabling the linear sensor to provide a differential signal that varies linearly with the position of the target object.

Figure 1:
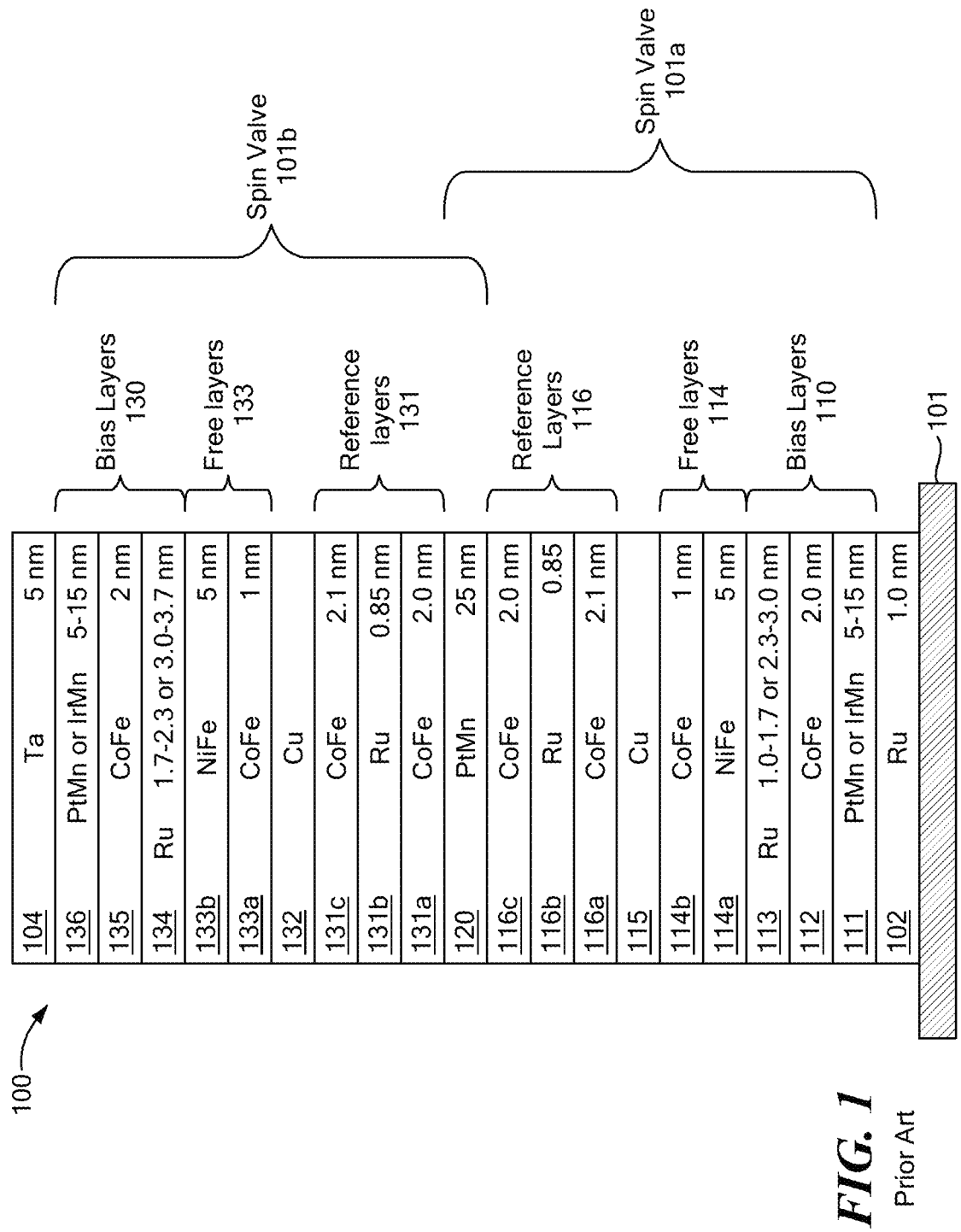
FIG. 1 is a diagram of an example of a dual double-pinned spin valve element.

Referring to FIG. 1, an MR element 100 is an example of a dual double-pinned spin valve element. The MR element 100 is deposited or otherwise provided upon a substrate 101 and includes a plurality of layers. The plurality of layers includes a nonmagnetic seed layer 102 disposed over the substrate 101, a first spin valve 101a disposed over the nonmagnetic seed layer 102 and a second spin valve 101b disposed over the first spin valve 101a. The plurality of layers also includes an antiferromagnetic pinning layer 120, which is shared by the first spin valve 101a and the second spin valve 101b, and a nonmagnetic cap layer 104 disposed over the second spin valve 101b.

The first spin valve 101a includes bias layers 110, free layer 114 and reference layers 116. The bias layers 110 includes an antiferromagnetic pinning layer 111 disposed over the nonmagnetic seed layer 102 and a ferromagnetic pinned layer 112 disposed over the antiferromagnetic pinning layer 111. The first spin valve 101a also includes a nonmagnetic spacer layer 113 disposed over the ferromagnetic pinned layer 112 with the free layers 114 structure 114 disposed over the nonmagnetic spacer layer 113. The free layers 114 includes a first ferromagnetic free layer 114a and a second ferromagnetic free layer 114b disposed over the first ferromagnetic free layer 114a.

The first spin valve 101a further includes a nonmagnetic spacer layer 115 disposed over the free layers 114 with the reference layers 116 disposed over the nonmagnetic spacer layer 115. The reference layers 116 includes a ferromagnetic layer 116a, a ferromagnetic pinned layer 116c and a nonmagnetic spacer layer 116b disposed therebetween.

The second spin valve 101b, which is similar to the first spin valve 101a, but includes layers that are in a substantially reverse order or arrangement as the layers which are shown in the first spin valve 101a with respect to the seed layer 102, includes reference layers 131 disposed over the antiferromagnetic pinning layer 120, a nonmagnetic spacer layer 132 disposed over the reference layers 131 and free layers 133 disposed over the nonmagnetic spacer layer 132. The reference layers 131 includes a first ferromagnetic layer 131a, a second ferromagnetic pinned layer 131c and a nonmagnetic spacer layer 131b disposed therebetween. Additionally, the free layers 133 includes a first ferromagnetic free layer 133a and a second ferromagnetic free layer 133b disposed over the first ferromagnetic free layer 133a.

The second spin valve 101b also includes bias layers 130. The bias layer 130 includes nonmagnetic spacer layer 134 disposed over the free layers 133, a ferromagnetic pinned layer 135 disposed over the nonmagnetic spacer layer 134 and an antiferromagnetic pinning layer 136 disposed over the ferromagnetic pinned layer 135. A nonmagnetic cap layer 104 is disposed over the antiferromagnetic pinning layer 136.

Each of the layers in MR element 100 includes one or more respective materials (e.g., magnetic materials) and has a respective thickness, as shown. Materials of the layers are shown by atomic symbols. Additionally, thicknesses of the layers are shown in nanometers. In other embodiments, the material and thicknesses of the layers in MR element 100 may be replaced with other materials and thicknesses.

Figure 2:
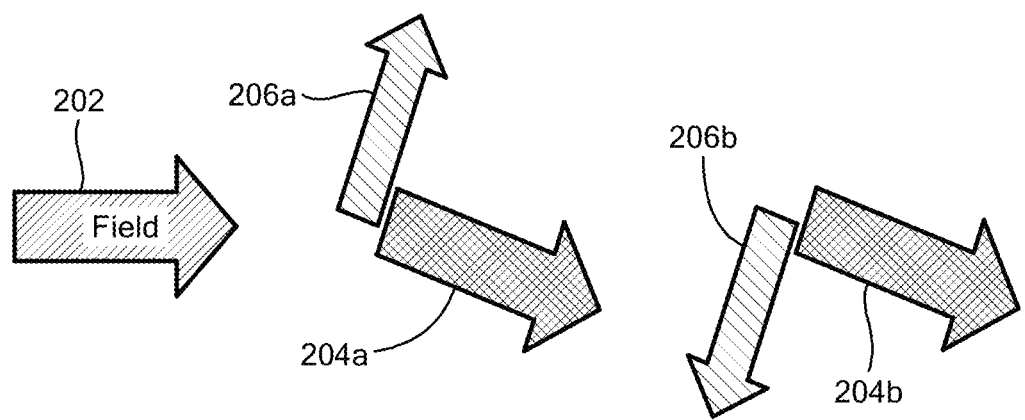
FIG. 2 is a diagram of an example of the magnetization directions of bias and reference layers for both spin valves shown in FIG. 1 with respect to a magnetic field direction.

Referring to FIG. 2, while the stack of FIG. 1 is known in the art (see, for example, FIG. 20 of U.S. Pat. No. 9,812, 637), magnetization directions of certain layers as described herein are not known in the art. For example, a magnetization direction 204a of reference layers (e.g., reference layers 116 (FIG. 1)) of a first spin valve (e.g., spin valve 101a (FIG. 1)) and a magnetization direction 204b of reference layers (e.g., reference layers 131 (FIG. 1)) of a second spin valve (e.g., spin valve 101b (FIG. 1)) are each tilted with respect to a magnetic field direction 202 forming a tilt angle that is neither parallel nor antiparallel with respect to the magnetic field direction 202.

Also, a magnetization direction 206a of free layers (e.g., free layers 114 (FIG. 1)) of the first spin valve (e.g., spin valve 101a (FIG. 1)) is (1) antiparallel to a magnetization direction 206b of free layers (e.g., free layers 133 (FIG. 1)) of the second spin valve (e.g., spin valve 101b (FIG. 1)); and (2) orthogonal to the magnetization direction 204a of the first spin valve. Likewise, the magnetization direction 206b of free layers of the second spin valve is (1) antiparallel to the magnetization direction 206a of the first spin valve; and (2) orthogonal to the magnetization direction 204b of the second spin valve. In some examples, the magnetization directions 204a, 204b of the reference layers are offset from the magnetic field direction 202 by between 10° to 50°.

The linear range of a dual spin valve element increases by tilting the magnetization directions 204a, 204b with respect to the magnetic field 202, and having the magnetization directions 206a, 206b being antiparallel to each other and orthogonal to the magnetization directions 204a, 204b. The increased linear range does not reduce the sensitivity of the dual spin valve element to detecting changes in a magnetic field. As further described herein, these dual spin valve elements may be used in bridges in a linear sensor to increase the linear range of the linear sensor without reducing the sensitivity of the linear sensor to detect changes in a magnetic field.

Figure 3B:
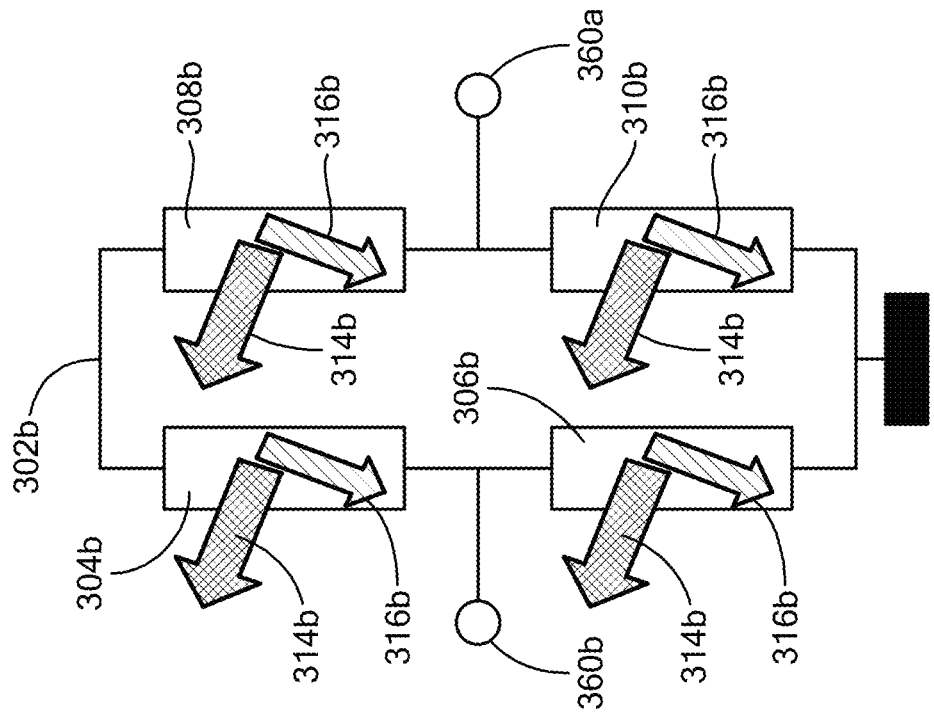
FIG. 3B is a circuit diagram of an example of a bridge with spin valves of a second type.
Figure 3A:
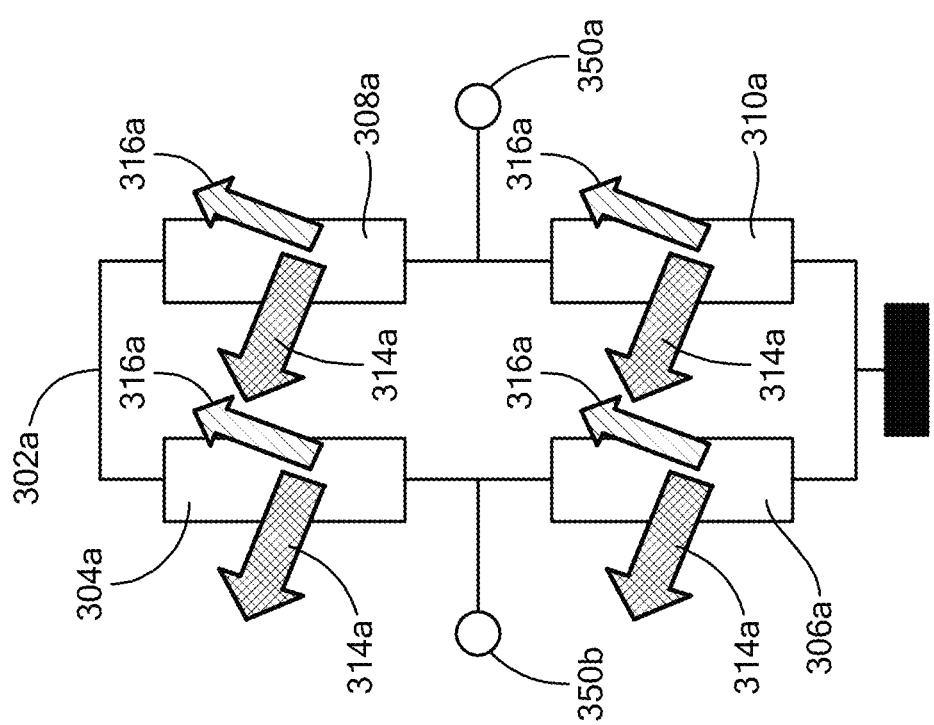
FIG. 3A is a circuit diagram of an example of a bridge with spin valves of a first type.

Referring to FIG. 3A, a bridge 302a includes a first spin valve 304a, a second spin valve 306a in series with the first spin valve 304a, a third spin valve 308a in parallel with the first spin valve 304a, and a fourth spin valve 310a in series with the third spin valve 308a. The bridge 302a also includes a first output terminal 350a and a second output terminal 350b that provide an output signal. The bridge 302a may be a voltage bridge, a current bridge, or a conductance bridge.

Each of the spin valves 304a, 306a, 308a, 310a are a first type. That is, the spin valves 304a, 306a, 308a, 310a are fabricated to be the same. In one particular example, the spin valves 304a, 306a, 308a, 310a are fabricated to be the same as the spin valve 101a (FIG. 1). Also, each of spin valves 304a, 306a, 308a, 310a have the same magnetization direction 314a of the reference layers and the same magnetization direction 316a of the free layers.

Referring to FIG. 3B, a bridge 302b includes a first spin valve 304b, a second spin valve 306b in series with the first spin valve 304b, a third spin valve 308b in parallel with the first spin valve 304b, and a fourth spin valve 310b in series with the third spin valve 308b. The bridge 302b also includes a first output terminal 360a and a second output terminal 360b that provide an output signal. The bridge 302b may be a voltage bridge, a current bridge, or a conductance bridge.

Each of the spin valves 304b, 306b, 308b, 310b are a second type. That is, the spin valves 304b, 306b, 308b, 310b are fabricated to be the same. In one particular example, the spin valves 304b, 306b, 308b, 310b are the same as the spin valve 101b (FIG. 1). Also, each of spin valves 304b, 306b, 308b, 310b have the same magnetization direction 314b of the reference layers and the same magnetization direction 316b of the free layers.

While the description of the bridges 302a, 302b were given using the spin valves of FIG. 1 as an example, other spin valves may be used other than those described in FIG. 1. Also, the spin valves of a first type and a second type need not be fabricated one on top of another. Rather, the spin valves of each type may be constructed side-by-side, for example, or spaced apart by some distance.

The spin valves of a first type may be either a giant magnetoresistance element (GMR) or a tunneling magnetoresistance element (TMR). The spin valves of a second type may be either a GMR or a TMR.

Figure 4:
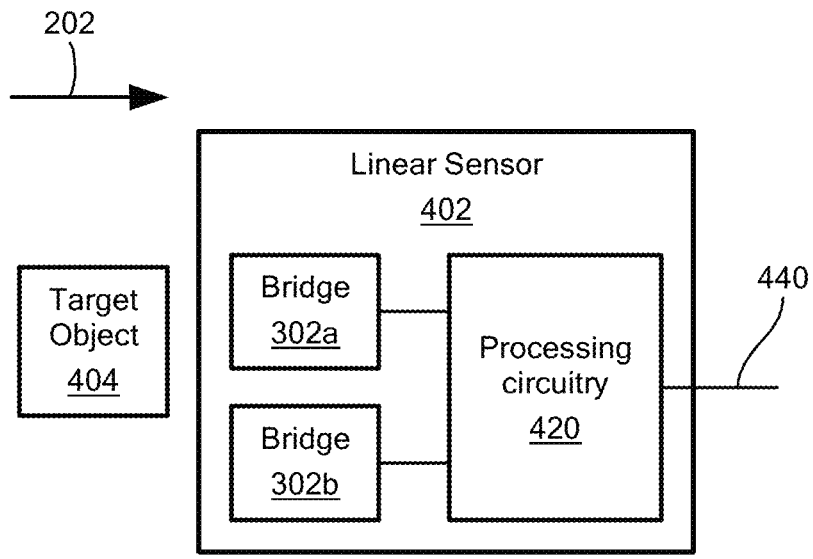
FIG. 4 is a block diagram of an example of a linear sensor that includes bridges of FIGS. 3A and 3B.

Referring to FIG. 4, an example of a linear sensor is a linear sensor 402. The linear sensor 402 includes the bridges 302a, 302b and processing circuitry 420. The bridges 302a, 302b each detects magnetic field changes caused by a target object 404 interacting with the magnetic field 202. The processing circuitry 420 processes the output signals from each bridge 302a, 302b to provide a signal 440, which is a differential signal indicating a linear position of the target object.

Figure 5:
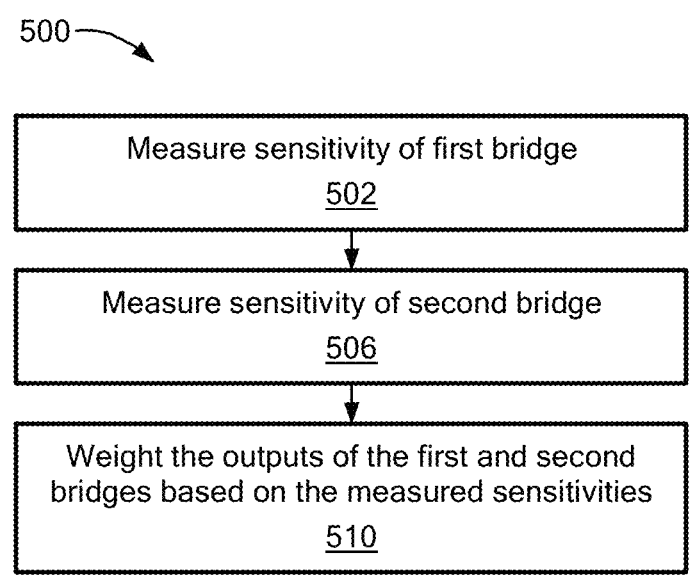
FIG. 5 is a flowchart of an example of a process to weight bridge outputs.

Referring to FIG. 5, in other embodiments, it may be desirable to weight the outputs of the bridges 302a, 302b. For example, if one bridge is more sensitive to changes in a magnetic field than another bridge, the bridge that is more sensitive is weighted higher than the bridge that is not as sensitive. An example, of a process to weight output of bridges (e.g., bridges 302a, 302b (FIGS. 3A and 3B)) is a process 500.

Process 500 measures sensitivity of a first bridge (502). For example, the output signal at the terminals 350a, 350b of the bridge 302a (FIG. 3A) is measured.

Process 500 measures sensitivity of a second bridge (506). For example, the output signal at the terminals 360a, 360b of the bridge 302b (FIG. 3B) is measured.

Process 500 weights the outputs of the first and second bridges based on the measured sensitivities (510). For example, the outputs of the bridges 302a, 302b are compared and the bridge with the larger signal output receives the higher weight.

Figure 6:
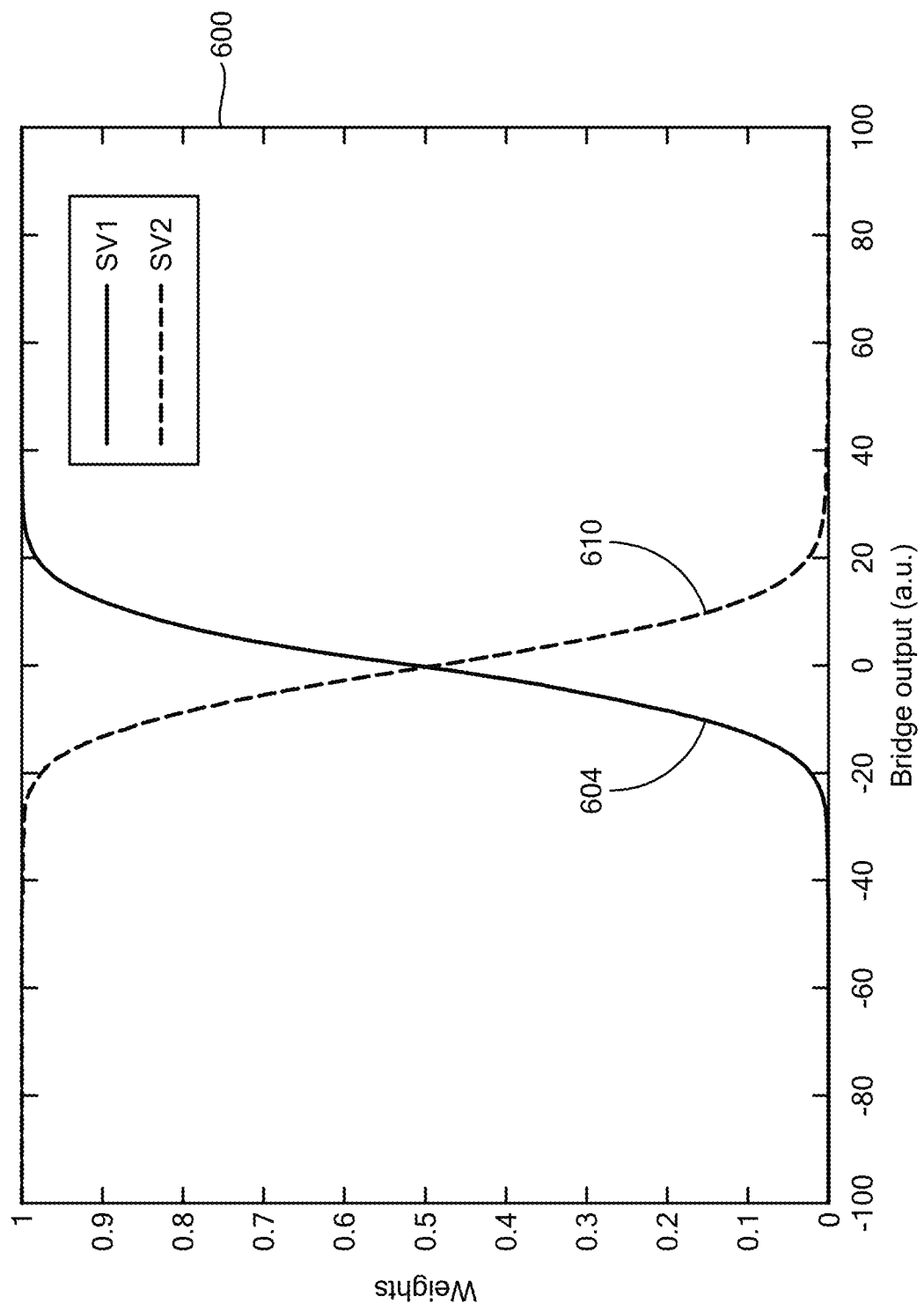
FIG. 6 is a graph of an example of weighting that may be used to weight bridge outputs.

Referring to FIG. 6, a graph 600 may be used for weighting in processing block 510 (FIG. 5). The graph 600 includes a weighting curve 604 corresponding to the bridge 302a (FIG. 3A) and a weighting curve 610 corresponding to the bridge 302b (FIG. 3B). In one particular example, if the output of the bridge 302a is −10, then the output of the bridge 302a is weighted 0.25 and the output of the second bridge is weighted 0.75.

Figure 7:
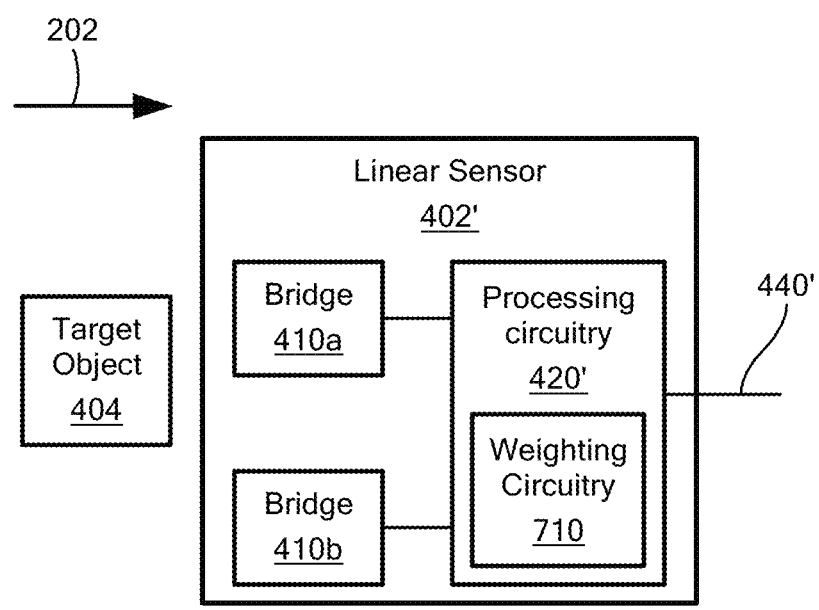
FIG. 7 is a block diagram of another example of a linear sensor that weights bridge outputs.

Referring to FIG. 7, another example of a linear sensor is a linear sensor 402'. The linear sensor 402' includes the bridges 410a, 410b and processing circuitry 420'. The bridges 410a, 410b each detects magnetic field changes caused by the target object 404 interacting with the magnetic field 202. The processing circuitry 420' includes weighting circuitry 710. The processing circuitry 420' processes the output signals from each bridge 410a, 410b and weights the output signals from the bridges 410a, 410b using the weighting circuitry 710 to provide a signal 440', which is a differential signal indicating a linear position of the target object.

Figure 8:
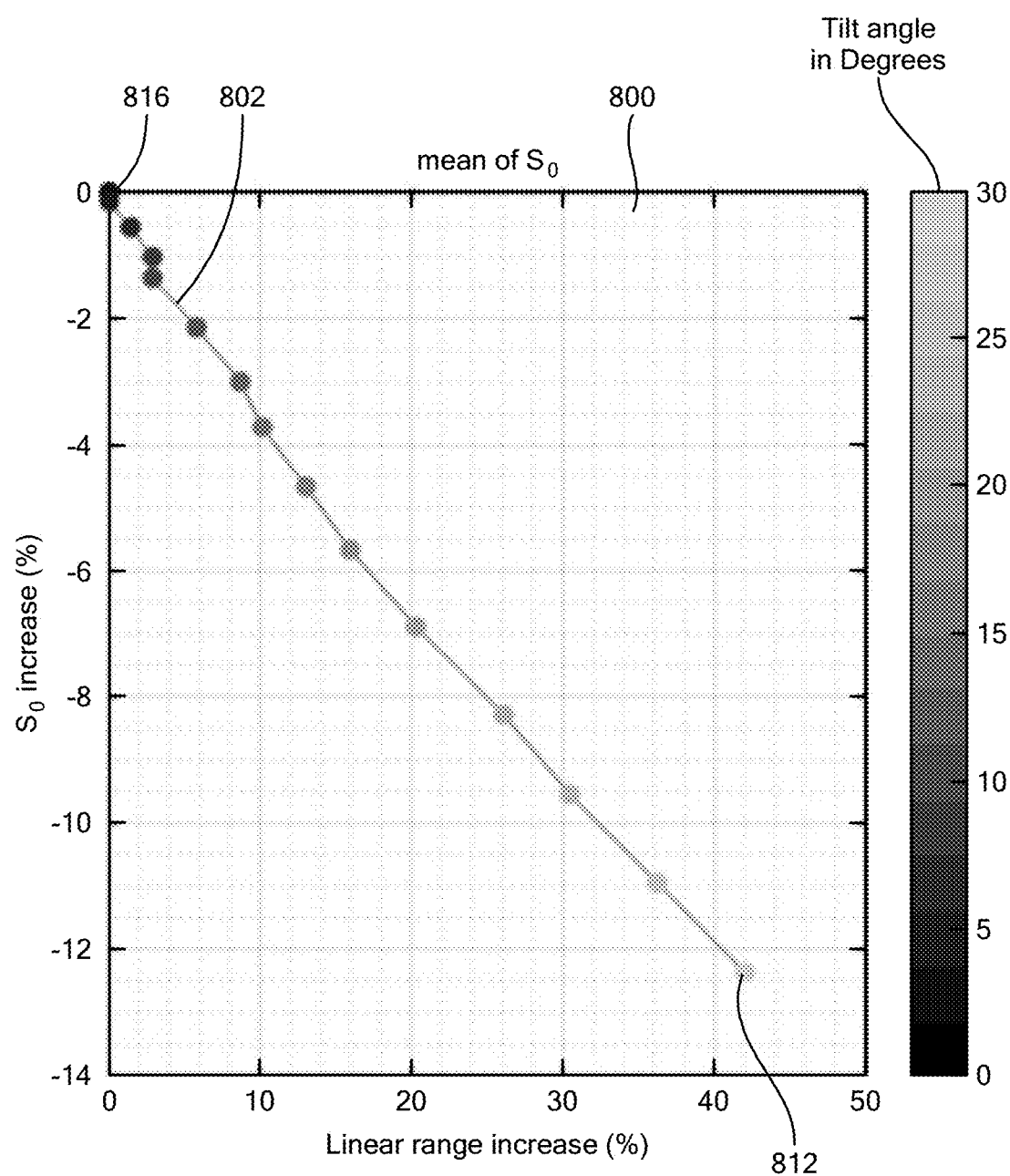
FIG. 8 is a graph of an example of changes in linear range with respect to changes in sensitivity for different tilt angles.

Referring to FIG. 8, a graph 800 depicts changes of sensitivity So with respect to changes in a linear range for different tilt angles. The curve 802 is a plot taken at different tilt angles. The point 812 corresponds to a 30° tilt angle and the point 816 corresponds to a 0° tilt angle. Points between the point 802 and the point 808 are linearly spaced between 0° and 30° by 2° steps.

Figure 9:
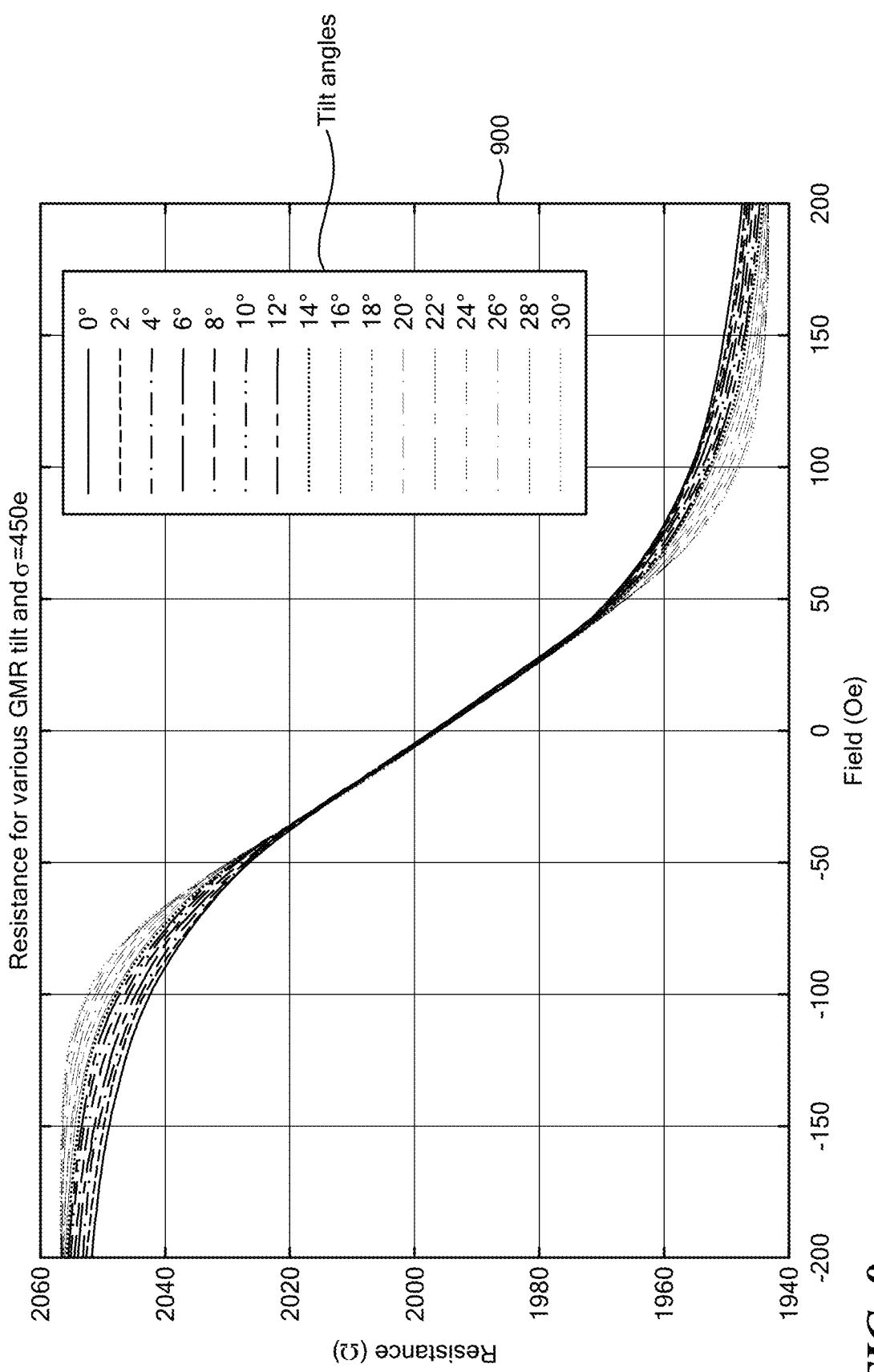
FIG. 9 is a graph of an example of changes in resistance using an erf function with different tilt angles.

Referring to FIG. 9, a graph 900 is an example that depicts how resistance changes using an erf function weight scheme with various tilt angles of the spin valves (e.g., spin valves 304a, 306a, 308a, 310a (FIG. 3A) and spin valves 304b, 306b, 308b, 310b (FIG. 3B)) used in a bridge (e.g., bridge 302a (FIG. 2A) and bridge 302b (FIG. 2B)). FIG. 9 may be used in weighting the outputs of the bridges (e.g., bridges 410a, 410b (FIG. 7)). The graph 900 is an example of depicting how the linear range may be increased while the sensitivity may be kept relatively constant. In this example, the width of the erf function is 45 Oe.

Figure 10:
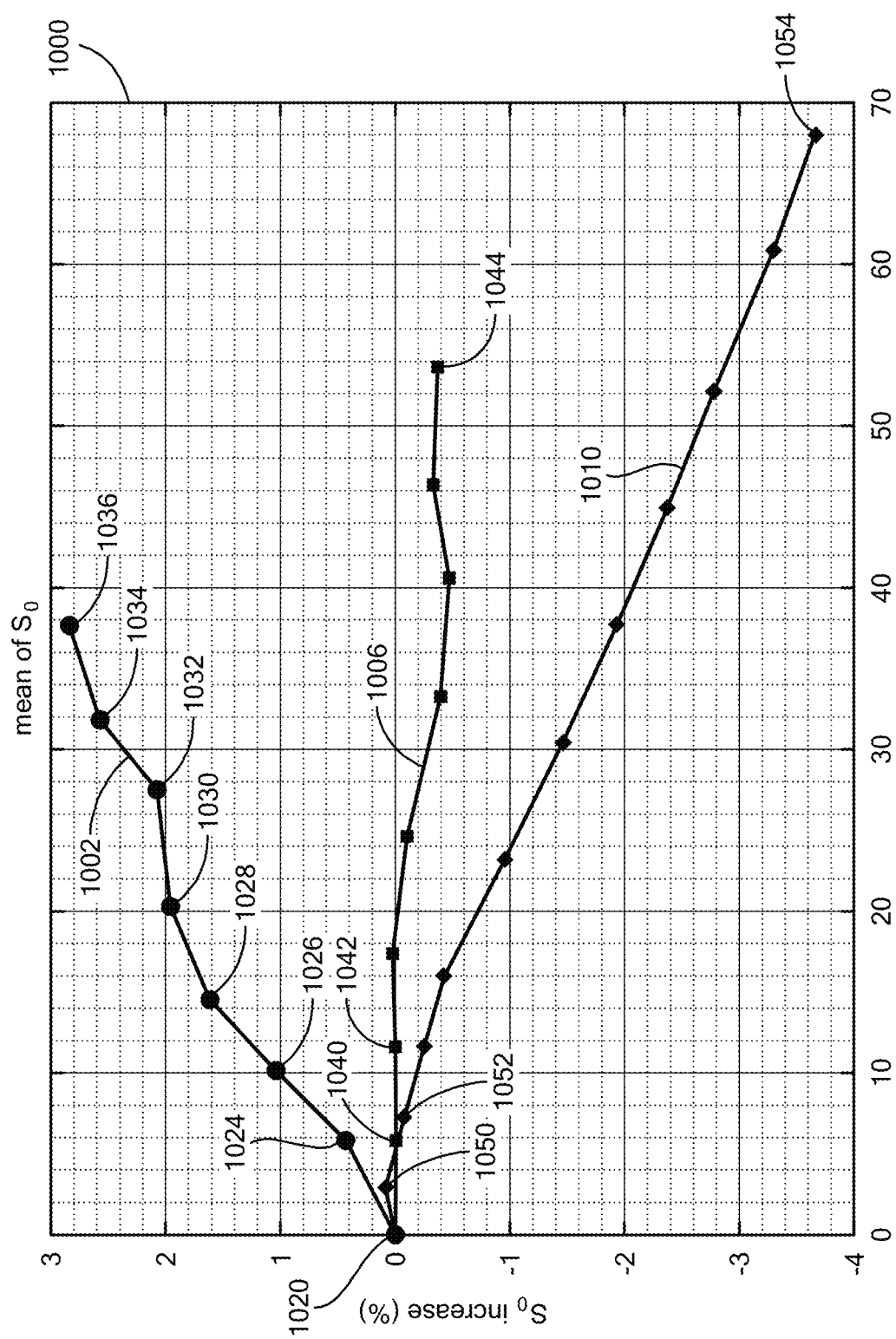
FIG. 10 is a graph of an example of changes in linear range and sensitivity for different erf function widths used for weighting bridge outputs.

Referring to FIG. 10, a graph 1000 depicts changes in linear range and sensitivity for different erf function widths. The Graph 1000 is used in weighting bridge outputs (e.g., the outputs of the bridges 410a, 410b (FIG. 7)).

A curve 1002 uses a weighting scheme with an erf function with a width of zero, which is equivalent to a Heaviside function. A curve 1006 uses a weighting scheme with an erf function with a width of 40 Oe. A curve 1010 uses a weighting scheme with an erf function with a width of 70 Oe.

Each measured point in the curves 1002, 1006, 1010 represents a different tilt angle. A point 1020 shared by the curves 1002, 1006, 1010 is a zero-degree tilt angle. For each curve 1002, 1006, 1010 moving left to right in the graph 1000, each new point is an increase of 2 degrees. For example, in the curve 1002, a point 1024 is at a 2° tilt angle, a point 1026 is at a 4° tilt angle, a point 1028 is at an 6° tilt angle, a point 1030 is at an 8° tilt angle, a point 1032 is at a 10° tilt angle, a point 1034 is at a 12° tilt angle, and a point 1036 is at a 14° tilt angle. In another example, in the curve 1006, a point 1040 is at a 2° tilt angle, a point 1042 is at a 4° tilt angle, and so forth to the point 1044 with a 16° tilt angle. In a further example, in the curve 1010, a point 1050 is at a 2° tilt angle, a point 1052 is at a 4° tilt angle, and so forth to the point 1054 with a 24° tilt angle.

The curve 1002 is the most sensitive of the three curves, 1002, 1006, 1010 in graph 1000. The curve 1006 provides negligible loss of sensitivity while maximizing the linear range by 54%. The curve 1010 provides the highest linear range (+68%) of the three curves, 1002, 1006, 1010 while losing a little sensitivity.

The graph 1000 is measured on a bridge with spin valves where each spin valve has a stack bias of 84 Oersted (Oe). The stack bias is the amplitude of the bias field applied to the free layer of a spin valve. In general, the higher the bias field, the large the linear range and the smaller the sensitivity to a magnetic field. Thus, the width of the erf function is scaled according to the stack bias in order to achieve the same result. For example, for a stack bias that is 168 Oe, the erf function width is doubled.

In traditional schemes, if one multiplies by X the linear range, then one would multiply by 1/X to get the new sensitivity. For example, to obtain 70% more linear range, the sensitivity would be decreased by 42% using traditional techniques. However, using the techniques described herein, the sensitivity would only be reduced by 4% (see, for example, curve 1010). In another example, to get 38% more linear range using traditional techniques, 28% of the sensitivity would be lost. However, using the techniques described herein, the sensitivity instead would be increased by only 2.8% (see, for example, curve 1002).

Figure 11:
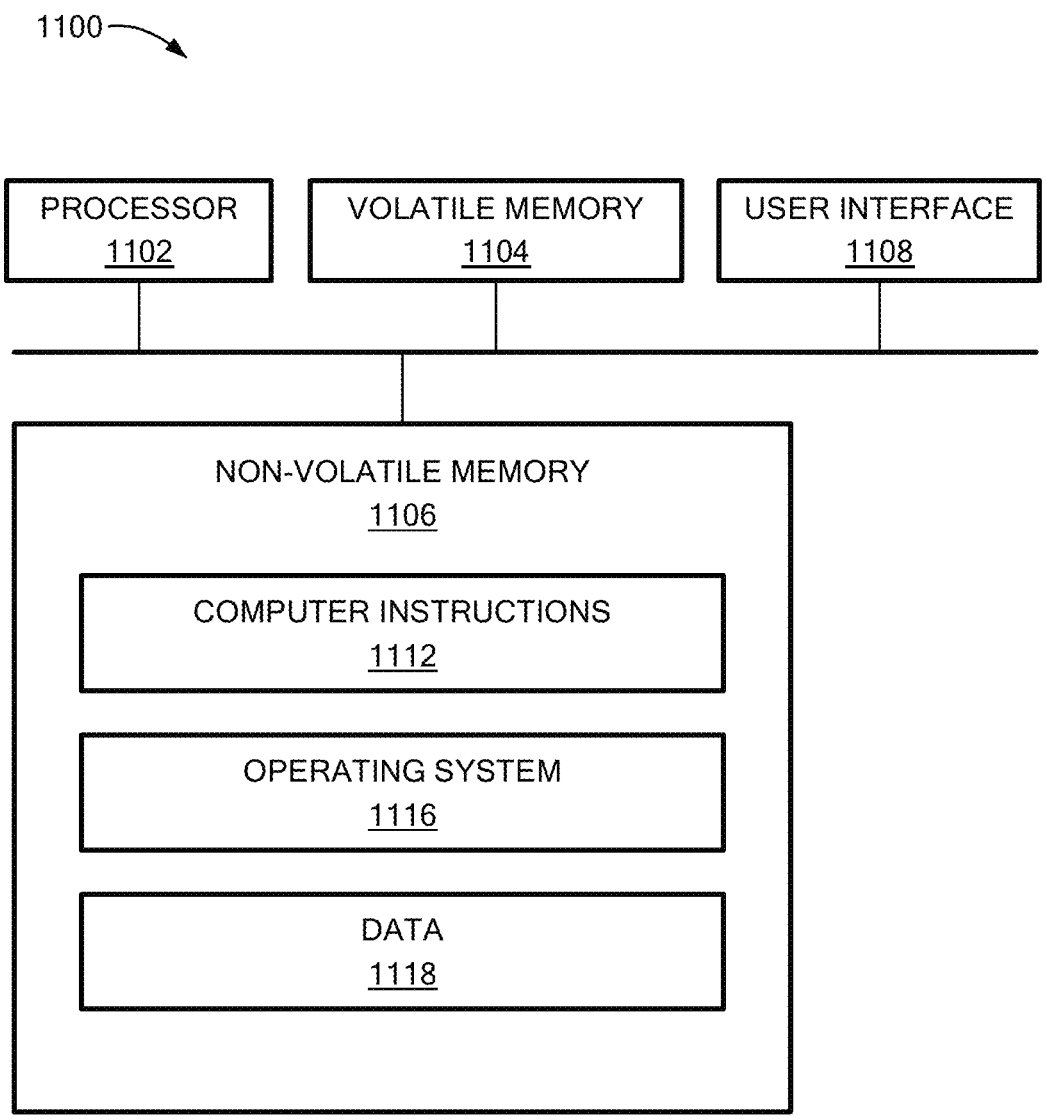
FIG. 11 is a block diagram of an example of a weighting processor on which the process of FIG. 5 may be implemented.

Referring to FIG. 11, an example of weighting circuitry 710 (FIG. 7) is weighting processor 1100, which includes a processor 1102, a volatile memory 1104, a non-volatile memory 1106 (e.g., hard disk) and the user interface (UI) 1108 (e.g., a graphical user interface, a mouse, a keyboard, a display, touch screen and so forth). The non-volatile memory 1106 stores computer instructions 1112, an operating system 1116 and data 1118. In one example, the computer instructions 1112 are executed by the processor 1102 out of volatile memory 1104 to perform all or part of the processes described herein (e.g., process 500).

The processes described herein (e.g., process 500) are not limited to use with the hardware and software of FIG. 11; they may find applicability in any computing or processing environment and with any type of machine or set of machines that can run a computer program. The processes described herein may be implemented in hardware, software, or a combination of the two. The processes described herein may be implemented in computer programs executed on programmable computers/machines that each includes a processor, a non-transitory machine-readable medium or other article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium), for execution by, or to control the operation of, data processing apparatus (e.g., a programmable processor, a computer, or multiple computers)). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

The processes described herein are not limited to the specific examples described. For example, the process 500 is not limited to the specific processing order of FIG. 5, respectively. Rather, any of the processing blocks of FIG. 5 may be re-ordered, combined, or removed, performed in parallel or in serial, as necessary, to achieve the results set forth above.

The processing blocks (for example, the process 500) associated with implementing the system may be performed by one or more programmable processors executing one or more computer programs to perform the functions of the system. All or part of the system may be implemented as, special purpose logic circuitry (e.g., an FPGA (field-programmable gate array) and/or an ASIC (application-specific integrated circuit)). All or part of the system may be implemented using electronic hardware circuitry that include electronic devices such as, for example, at least one of a processor, a memory, programmable logic devices or logic gates.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A linear sensor comprising:
   a first bridge comprising:
      a first spin valve;
      a second spin valve in series with the first spin valve;
      a third spin valve in parallel with the first spin valve; and
      a fourth spin valve in series with the third spin valve; and
   a second bridge comprising:
      a fifth spin valve;
      a sixth spin valve in series with the fifth spin valve element;
      a seventh spin valve in parallel with the fifth spin valve; and
      an eighth spin valve in series with the seventh spin valve,
   wherein the first spin valve comprises:
      a first set of reference layers having a magnetization direction in a first direction;

a first set of free layers having a magnetization direction in a second direction orthogonal to the first direction; and wherein the fifth spin valve is positioned on the first spin valve, wherein the fifth spin valve comprises:
    a second set of reference layers having a magnetization direction in the first direction;
    a second set of free layers having a magnetization direction in a third direction orthogonal to the first direction and antiparallel to the second direction, wherein the first direction is neither parallel nor antiparallel to a direction of an external magnetic field, wherein the first and second bridges detect magnetic field changes caused by a target object enabling the linear sensor to provide a differential signal indicating a linear position of the target object.

2. The linear sensor of claim 1, wherein the first, second, third and fourth spin valves are electrically the same.

3. The linear sensor of claim 2, wherein the fifth, sixth, seventh and eighth spin valves are electrically the same.

4. The linear sensor of claim 3, wherein the sixth spin valve is positioned on the second spin valve,
    wherein the seventh spin valve is positioned on the third spin valve, and
    wherein the eighth spin valve is positioned on the fourth spin valve.

5. The linear sensor of claim 1, wherein the first set of reference layers and the second set of reference layers share one or more layers.

6. The linear sensor of claim 5, wherein the first spin valve further comprises a first set of free layers positioned between the first set of reference layers and the first set of bias layers, and
    wherein the second spin valve further comprises a second set of free layers positioned between the second set of reference layers and the second set of bias layers.

7. The linear sensor of claim 1, wherein the first spin valve is either a giant magnetoresistance element (GMR) or a tunneling magnetoresistance element (TMR).

8. The linear sensor of claim 7, wherein the second spin valve is either a giant magnetoresistance element (GMR) or a tunneling magnetoresistance element (TMR).

9. The linear sensor of claim 1, wherein the output of the first bridge and the second bridge are weighted with respect to each other based on their respective sensitivities.

10. The linear sensor of claim 1, wherein the first bridge is a voltage bridge, and the second bridge is a voltage bridge.

11. The linear sensor of claim 1, wherein the first bridge is a current bridge, and the second bridge is a current bridge.

12. The linear sensor of claim 1, wherein the first bridge is a conductance bridge, and the second bridge is a conductance bridge.

13. The linear sensor of claim 1, wherein the first direction and the direction of the expected magnetic field form a tilt angle,
    wherein the tilt angle is between 0° and 30°.

14. The linear sensor of claim 13, wherein the tilt angle enables the linear sensor to have a linear range more than 65% greater than a linear sensor with a tilt angle of 0° and to have a sensitivity no more than 4% less than a sensitivity of the linear sensor with the tilt angle of 0°.

15. The linear sensor of claim 13, wherein the tilt angle enables the linear sensor to have a linear range more than 50% greater than a linear sensor with a tilt angle of 0° and to have a sensitivity no more than 0.25% less than a sensitivity of the linear sensor with the tilt angle of 0°.

16. The linear sensor of claim 13, wherein the tilt angle enables the linear sensor to have a linear range more than 35% greater than a linear sensor with a tilt angle of 0° and to have a sensitivity more than 2.5% greater than a sensitivity of the linear sensor with the tilt angle of 0°.

17. A method comprising,
    forming a linear sensor comprising:
        a first bridge comprising a first set of spin valves each comprising a first set of reference layers having a magnetization direction in a first direction; and
        a second bridge comprising a second set of spin valves each comprising a second set of reference layers having a magnetization direction in the first direction, wherein the first direction is neither parallel nor antiparallel to a direction of an expected magnetic field, wherein the first direction and the direction of the expected magnetic field form a tilt angle, wherein the tilt angle is greater than 0°;
    measuring a sensitivity of a first bridge to changes in a magnetic field;
    measuring a sensitivity of a second bridge to changes in the magnetic field; and
    weighting an output of the first bridge and an output of the second bridge based on the measured sensitivities of the first and second bridges.

18. The method of claim 17, wherein the tilt angle enables the linear sensor to have a linear range more than 65% greater than a linear sensor with a tilt angle of 0° and to have a sensitivity no more than 4% less than a sensitivity of the linear sensor with the tilt angle of 0°.

19. The method of claim 17, wherein the tilt angle enables the linear sensor to have a linear range more than 50% greater than a linear sensor with a tilt angle of 0° and to have a sensitivity no more than 0.25% less than a sensitivity of the linear sensor with the tilt angle of 0°.

20. The method of claim 17, wherein the tilt angle enables the linear sensor to have a linear range more than 35% greater than a linear sensor with a tilt angle of 0° and to have a sensitivity more than 2.5% greater than a sensitivity of the linear sensor with the tilt angle of 0°.

* * * * *

UNITED STATES PATENT AND TRADEMARK OFFICE
CERTIFICATE OF CORRECTION

| | |
|---|---|
| PATENT NO. | : 11,630,168 B2 |
| APPLICATION NO. | : 17/166301 |
| DATED | : April 18, 2023 |
| INVENTOR(S) | : Rémy Lassalle-Balier et al. |

It is certified that error appears in the above-identified patent and that said Letters Patent is hereby corrected as shown below:

In the Specification

Column 3, Line 51 delete "layer 114" and replace with --layers 114--.

Column 3, Line 57 delete "114 structure 114" and replace with --114 structure--.

Column 4, Line 17 delete "layer 130" and replace with --layers 130--.

Column 4, Line 58 delete "field 202," and replace with --field direction 202,--.

Column 6, Line 34 delete "point 802 and the point 808" and replace with --point 812 and the point 816--.

Column 6, Line 41 delete "(FIG. 2A)" and replace with --(FIG. 3A)--.

Column 6, Line 41 delete "(FIG. 2B))." and replace with --(FIG. 3B))--.

Column 7, Line 15 delete "large" and replace with --larger--.

Signed and Sealed this
Nineteenth Day of March, 2024

Katherine Kelly Vidal
*Director of the United States Patent and Trademark Office*